United States Patent

Jha et al.

[11] Patent Number: 5,156,923
[45] Date of Patent: Oct. 20, 1992

[54] HEAT-TRANSFERRING CIRCUIT SUBSTRATE WITH LIMITED THERMAL EXPANSION AND METHOD FOR MAKING

[75] Inventors: Sunil C. Jha, Attleboro, Mass.; James A. Forster, Barrington, R.I.

[73] Assignee: Texas Instruments Incorporated, Dallas, Tex.

[21] Appl. No.: 818,634

[22] Filed: Jan. 6, 1992

[51] Int. Cl.⁵ .................. B32B 3/10; H01L 23/373; H05K 7/20; B23K 20/04
[52] U.S. Cl. .................. 428/614; 428/635; 228/190; 357/81; 361/386; 361/388
[58] Field of Search .......... 428/614, 635; 357/70, 357/81; 361/386, 388, 421; 165/905; 72/363; 228/190

[56] References Cited

U.S. PATENT DOCUMENTS

| | | | |
|---|---|---|---|
| 1,144,106 | 6/1915 | Burgess | 428/635 |
| 3,068,564 | 12/1962 | Wiedt | 228/190 |
| 3,295,935 | 1/1967 | Pflumm et al. | 428/635 |
| 3,399,332 | 8/1968 | Savolainen | 317/234 |
| 3,609,855 | 10/1971 | Schmidt | 228/190 |
| 4,158,719 | 6/1979 | Frantz | 428/567 |
| 4,283,464 | 8/1981 | Hascoe | 428/614 |
| 4,472,762 | 9/1984 | Spinelli et al. | 361/386 |
| 4,569,692 | 2/1986 | Butt | 75/235 |
| 4,606,979 | 8/1986 | Takeuchi | 72/363 |
| 4,663,242 | 5/1987 | Pryor | 428/614 |
| 4,894,293 | 6/1990 | Breit et al. | 428/614 |
| 4,996,115 | 2/1991 | Eerkes et al. | 428/614 |
| 5,039,335 | 8/1991 | Gondusky et al. | 75/246 |

FOREIGN PATENT DOCUMENTS

| | | | |
|---|---|---|---|
| 385605 | 9/1990 | European Pat. Off. | 357/81 |
| 60-239033 | 11/1985 | Japan | 428/635 |

OTHER PUBLICATIONS

M. A. Hunter, "Low Expansion Alloys", Metals Handbook, 8th Ed., vol. 1, pp. 816–819.

*Primary Examiner*—John Zimmerman
*Attorney, Agent, or Firm*—Russell E. Baumann; Richard L. Donaldson; René E. Grossman

[57] ABSTRACT

Layers of copper and Invar are cold pressure rolled with reduction in thickness to be metallurgically bonded together in interleaved relation, and strips of the bonded materials are cold pressure rolled together a plurality of times with reduction in thickness to be metallurgically bonded together to form a metal composite and to break up the layers of Invar in the composite, thereby to distribute portions of the Invar material in a copper matrix to limit thermal expansion of the composite while permitting the matrix to extend in continuous phase along three mutually perpendicular axes through the composite substantially free of diffusion between the copper and Invar materials.

15 Claims, 2 Drawing Sheets

HEAT-TRANSFERRING CIRCUIT SUBSTRATE WITH LIMITED THERMAL EXPANSION AND METHOD FOR MAKING

BACKGROUND OF THE INVENTION

The field of the invention is that of heat-transfer members having selected thermal expansion properties, and the invention relates more particularly to a novel and improved heat-transferring substrate for an electronic circuit and to novel and improved methods for making the substrate.

A commonly used electronic circuit substrate comprises a composite metal having two outer layers of a metal such as copper of relatively high thermal conductivity metallurgically bonded to opposite sides of a core layer of a low expansion metal such as the alloy of 36 percent nickel and the balance iron. That iron alloy is commercially available under the designation Invar. One side of the substrate is typically coated with a thin layer of electrical insulation to support a printed circuit and circuit components in close heat-transfer relation to the substrate. In that arrangement, the substrate not only provides rigid support for the printed circuit, etc. but also provides a heat-sink for withdrawing and dissipating heat from the circuit. The low expansion core of the substrate limits thermal expansion of the substrate to avoid breaking of circuit connections or separation of circuit components from the substrate during thermal cycling of the circuit. However, while the commonly used circuit substrate is highly effective for many circuit applications, the thermal conductivity of the substrate in a direction perpendicular to the layers—the so called Z-axis thermal conductivity—is somewhat limited.

A number of methods for making composite metal circuit substrates having improved Z-axis thermal conductivity have been proposed but thus far have tended to be somewhat ineffective or to be relatively expensive to make. In one proposed process, for example, powders of copper and Invar material are blended together and sintered to form a substrate which has a copper matrix material extending in continuous phase along three mutually perpendicular axes through the substrate. The Invar particles are distributed throughout the copper matrix to limit thermal expansion of the substrate. However, the sintering used for bonding the copper and Invar materials together and for achieving suitable density in the substrate causes diffusion between the copper and iron alloy materials and results in significant loss of thermal conductivity in the copper materials in the substrate. The substrate materials also tend to be relatively expensive to make, particularly in the variety of thicknesses likely to be required for various circuit applications. A proposed method for making such a composite powder metallurgy substrate without such diffusion calls for initially coating the Invar particles with copper to permit use of lower sintering temperatures but again the proposed process tends to be relatively expensive. In another proposed process, silver and Invar powders are sintered to form a substrate without significant loss of thermal conductivity in the silver material but here material costs as well as processing costs are high. Other proposed processes for making such substrates involve perforating a plate of copper or Invar material and then filling the perforations of Invar or copper to provide a desired Z-axis thermal conductivity. Again, however, the process is relatively expensive and flatness is difficult to achieve. It would be desirable if composite metal substrates with improved Z-axis thermal conductivity could be made in a convenient and inexpensive manner.

BRIEF SUMMARY OF THE INVENTION

It is an object of the invention to provide a novel and improved method for making a composite metal heat-transfer member; to provide such a method for making a heat-transfer metal substrate for use in mounting printed circuits; to provide such a method which provides a substrate with improved Z-axis thermal conductivity in a novel and inexpensive manner; and to provide novel and improved composite metal substrates made by such methods.

Briefly described, the novel and improved heat-transferring member of the invention is made by providing a plurality of layers of metal of relatively high thermal conductivity such as copper, silver or aluminum or the like and interleaving those metal layers with layers of metal of relatively low thermal expansion properties such as Invar or Kovar or molybdenum or the like. The interleaved metal layers are then pressure rolled together to reduce the thicknesses of the layer materials to metallurgically bond the layer materials to each other to form a composite multilayer metal material. A plurality of strips of the composite multilayer material are then pressure rolled with further reduction in thickness for metallurgically bonding the multilayer strip materials together. This procedure is repeated until the layers of the low expansion metal materials break up in the composite and are distributed throughout a metal matrix formed of the other high, thermal conductivity metal material, thereby to provide a composite material having selected thermal expansion properties while also having the high thermal conductivity matrix extending in continuous phase along three mutually perpendicular axes to provide the composite with high thermal conductivity along all of those axes. Where the layer materials are subject to diffusion with each other at elevated temperatures, the layer materials are preferably cold pressure rolled for metallurgically bonding the metal layer materials together in the solid phase substantially free of diffusion between the metal materials. The improved composite is preferably incorporated in a circuit board or lead frame to provide an improved circuit unit.

DESCRIPTION OF THE DRAWINGS

Other objects, advantages and details of the novel and improved methods and heat-transfer member of the invention appear in the following detailed description of preferred embodiments of the invention, the detailed description referring to the drawings in which.

DESCRIPTION OF THE PREFERRED EMBODIMENTS

Figure 1:
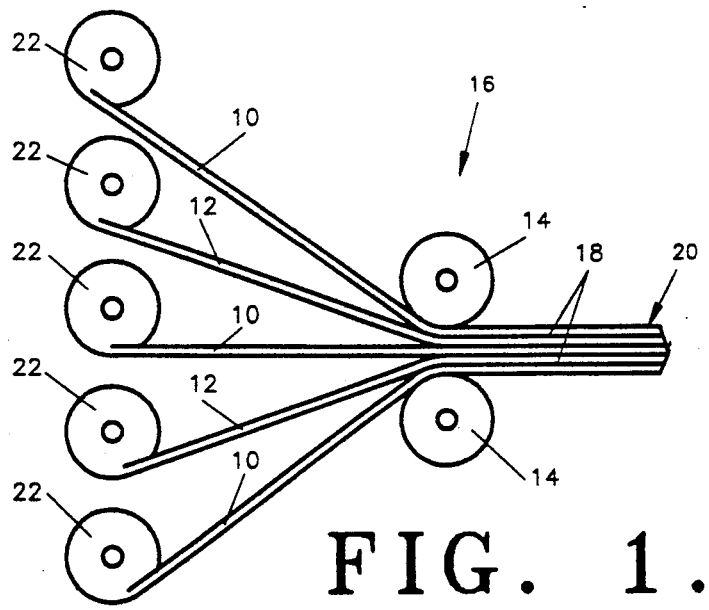
FIGS. 1, 2 and 3 are side elevation views diagrammatically illustrating successive steps in the method of the invention.
Figure 4:
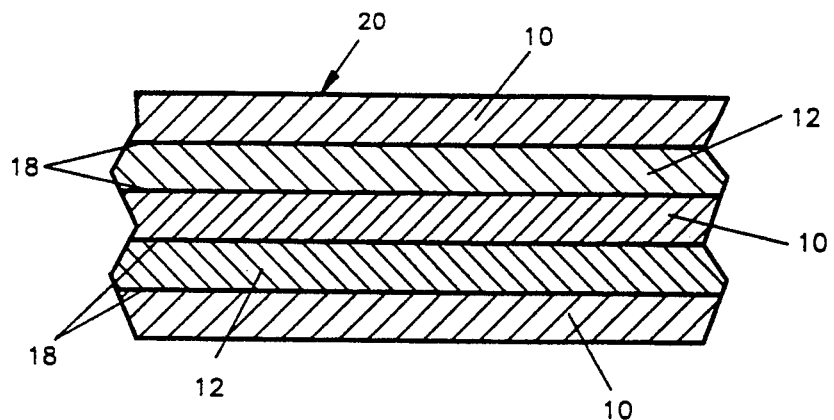
FIG. 4 is a section view along a longitudinal axis of an intermediate stage product produced in a step of the process shown in FIG. 1.

In accordance with the novel and improved method of the invention, at least one layer of a first metal material 10 of relatively high thermal conductivity and at least one layer of a second metal material 12 of relatively low thermal expansion properties are passed between a pair of pressure rolls 14 in a conventional metal rolling mill 16 and are squeezed together with sufficient force to be reduced in thickness and metallurgically bonded together along interfaces 18 between the metal layers to form a composite multilayer metal 20 as shown in FIG. 1. Preferably, for example, two layers of the second metal material 12 are interleaved with three layers of the first metal material 10 and are reduced in thickness and metallurgically bonded together to form a five layer composite multilayer metal 20 as shown in FIG. 4.

Preferably the first metal material 10 comprises a metal of high thermal conductivity such as copper, silver or aluminum or the like and preferably the second metal material 12 of relatively low thermal expansion properties comprises an iron alloy metal material or a low expansion metal such as molybdenum. If desired, the group from which the second metal material is selected comprises iron alloys having a nominal composition by weight of from about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese and the balance iron.

Figure 2:
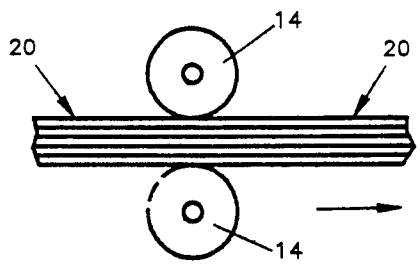

In a preferred embodiment of the invention, for example, two layers 10 of low expansion iron alloy metal material having a nominal composition by weight of 36 percent nickel and the balance iron (Invar) are fed from supply reels 22 and are interleaved with three layers 12 of pure copper fed from corresponding supply reels. The interleaved metal layers each have an initial thickness of 0.020 inches, and they are pressure rolled between the rolls 14 to be reduced in thickness by 60 percent in a single pass through the rolls so that the metal layers 10 and 12 are metallurgically bonded together along the interfaces 18 to form the composite multilayer metal 20. Preferably, as shown in FIG. 2, the composite multilayer metal 20 is again pressure rolled to be reduced in thickness by about 50 percent so that the composite multilayer metal 20 as reduced in thickness has a thickness of 0.020 inches.

Figure 3:
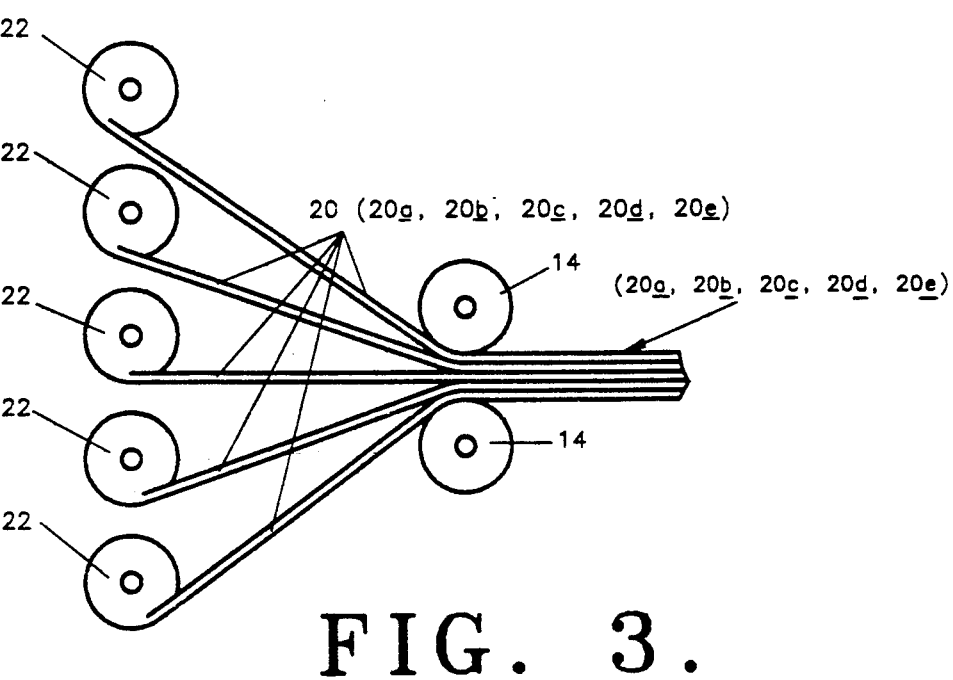

Five strips of the reduced-thickness multilayer metal 20 are then fed from respective supply reels 22 between pressure rolls 14 as shown in FIG. 3 to be reduced in thickness by 60 percent in a single pass between the rolls so that the strips of the composite multilayer metal 20 are metallurgically bonded to each other to form a composite multilayer metal 20a having an increased number of relatively thinner layers than the composite multilayer metal 20. That is, where the composite multilayer metal 20 has 5 layers alternately formed of metals of relatively high thermal conductivity and of metals of relatively low thermal expansion properties, the composite multilayer metal 20a has 25 layers of metal material metallurgically bonded together. Where the first metal of relatively high thermal conductivity comprises 60 percent by volume of the composite multilayer metal 20, that same volume ratio is substantially maintained in the 25 layer composite multilayer 20a.

Preferably, these last process steps are repeated a plurality of times as necessary for progressively increasing the number of metal layers embodied in the composite metal layer and for progressively reducing the thickness of the metal layers of the second metal of relatively low thermal expansion properties until layers of the second metal break up into separate portions or platelets 12.1 of the second metal which are distributed through a matrix 10.1 formed of the first metal of relatively high thermal conductivity. That is, the composite multilayer metal 20a is passed between the rolls 14 to be reduced in thickness by 50 percent so that the composite multilayer metal 20a has a reduced thickness of about 0.020 inches. Then, as is indicated by the reference numerals in parentheses in FIG. 3, five strips of the reduced thickness composite multilayer metal 20a are fed from the reels 22 through the pressure rolls 14 reels 22 through the pressure rolls 14 and are again reduced in thickness and metallurgically bonded together to form a composite multilayer metal 20b having 125 metal layers metallurgically bonded together. If desired, these process steps are then repeated for forming composite multilayer metals 20c, 20d, etc., having 625, 3125, etc., layers until the layers of the second metal of relatively low thermal expansion break up and distribute the portions 12.1 of the second metal throughout the metal matrix 10.1. In the exemplary embodiment where the first and second metals comprise pure copper and Invar as described above, it is found that the second metal layers 12 break up where the composite multilayer metal 20 having 25 layers each of about 0.0008 inches thickness are combined to form a composite metal 20b which would tend to have 125 layers, the layers of the second material being substantially broken up and the low expansion second metal material portions 12.1 being well distributed in the metal matrix 10.1 as the composite metal 20b is formed.

Figure 5:
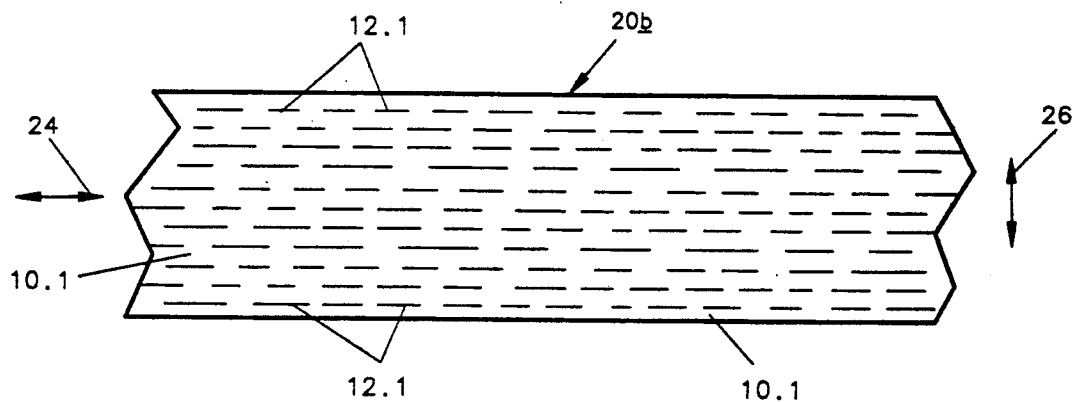
FIG. 5 is a side elevation view similar to FIG. 4 illustrating the product produced in the process of the invention.
Figure 6:
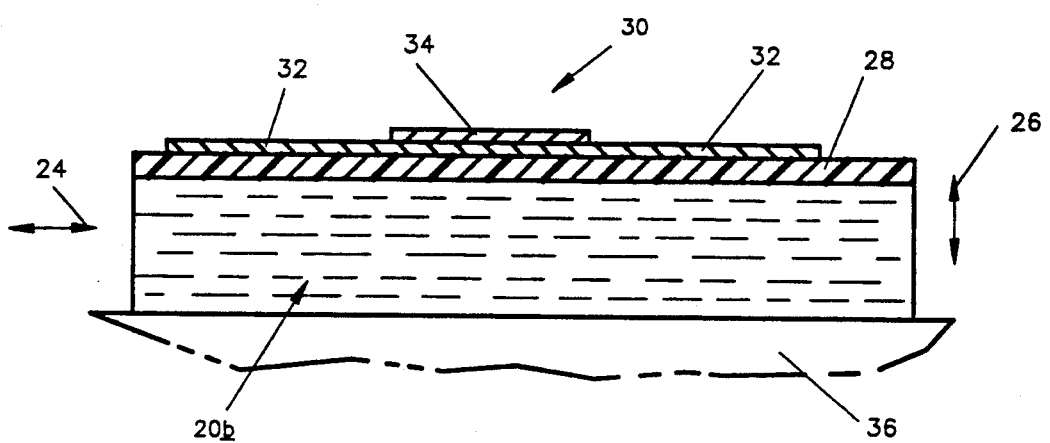
FIG. 6 is a section view similar to FIG. 4 to smaller scale illustrating use of the substrate of FIG. 5 in mounting an electronic circuit.

In that arrangement, the first metal material of relatively high thermal conductivity extends in continuous phase in three mutually perpendicular directions through the composite metal 20b. That is, the continuous copper phase extends along an X-axis as indicated in FIGS. 5 and 6 by the arrow 34, extends along a Y-axis into the plane of the composite 20b as viewed in FIGS. 5 and 6, and extends along the Z-axis through the composite 20b as indicated by arrow 26. The high thermal conductivity first metal extends between broken up portions 12.1 of the low expansion second metal in the composite to provide the composite with improved thermal conductivity along the Z-axis. Where the first and second metals would tend to diffuse with each other at elevated temperatures as in the exemplary copper-Invar embodiment noted above, the pressure rolling reductions in thickness are carried out cold in the present process so that the metallurgical bonds between the metal layers in the composite multilayer metals are formed in the solid phase to maintain the first and second metals substantially free of diffusion such as might lower the thermal conductivity properties of the first metal. That is, the thickness reductions are carried out at temperatures which would avoid such diffusion. Preferably the noted process steps are carried out at temperatures which avoid annealing of the low expansion metal to facilitate breaking up of layers of the second metal as the stresses established in reduced thickness layers 12 during the thickness reductions exceed the yield strength of the metals in the layers 12. If desired, the composite material is subjected to heat treatment to improve bonding and processability of the composite, the heat treatment being selected and controlled to avoid diffusion, etc., such as might reduce thermal conductivity as noted above.

In that arrangement, the composite metal 20b with broken up layer portions 12.1 distributed through the metal matrix 10.1 is fully dense, has selected thermal expansion properties substantially corresponding to the average of the first and second metals weighted for their relative volumes and relative elastic moduelus in the composite 20b, and has selected thermal conductivity properties also corresponding to the average of the first and second metals as weighted for their relative volumes in the composite metal 20b. If desired, the ratio of the volumes of the first and second metals are selected by selecting the number and thicknesses of the layers 10 and 12 of the first and second metals. The thermal conductivity properties of the composite metal 20b are also excellent along the three mutually perpendicular axes, X, Y and Z through the composite. If desired, where there is sufficient break-up of the second metal layers 12.1, the thermal conductivity is adapted to be substantially the same along all three axes, or where more or less break-up is provided relative to the layer thicknesses, the relative thermal conductivity along the three axes is adapted to be selected as desired.

In another preferred embodiment of the invention, for example, equal thickness layers of pure copper are pressure rolled to be reduced in thickness and metallurgically bonded to opposite sides of an Invar core layer to form a composite multilayer metal, the core layer constituting 60 percent of the composite thickness. Five strips of the composite multilayer metal are then pressure rolled to be reduced in thickness and metallurgically bonded together to form a 15 metal layer composite. Five strips of the 15 layer composite are then pressure rolled to be reduced in thickness and metallurgically bonded together to form a 75 layer composite, and five strips of the 75 layer composite are pressure rolled to be reduced in thickness and metallurgically bonded together to form a composite which would tend to have 375 layers. In forming the latter composite, the metal layers of the low expansion Invar material are broken up and distributed through a copper metal matrix substantially free of diffusion between the copper and Invar materials. The composite displays thermal expansion of 6.1 PPM/°C. in the temperature range from 25° C. to 150° C. and displays substantially improved Z-axis conductivity as compared to the initial 3 layer composite.

The composite material provided by the process of the invention is thus adapted to be used as a heat-transferring substrate member for an electronic circuit to withdraw and dissipate heat from the circuit. For example, where the composite 20b is provided with a thin insulating coating 28 provided on one side of the composite and has an electronic circuit 30 diagrammatically indicated by circuit paths 32 and circuit components 34 in FIG. 6 mounted on the insulating coating, the substrate 20b is adapted to withdraw heat from the circuit through the thin insulating coating 28 to distribute that heat throughout the substrate as indicated by the arrow 24, and to transfer that heat to a support 36 or the like as indicated by the arrow 26. The composite material is also adapted for use in lead frames for mounting integrated circuit units. That is, in the examplary embodiment of FIG. 6, the composite 20b may comprise a lead frame. In that case, the composite conducts heat from the component 34 to circuit paths 38 on the support 36 to be dissipated along paths 38.

It should be understood that although particular embodiments of the invention have been described by way of illustrating the invention, the invention includes all modifications and equivalents of the described embodiments falling within the scope of the appended claims.

We claim:

1. A method for making a metal heat-transfer member of
    selected thermal expansion properties comprising the steps of pressure rolling a plurality of layers of a first metal material
    of relatively high thermal conductivity in interleaved relation with a plurality of layers of a second metal material of relatively low thermal expansion properties with reduction in thicknesses thereof for metallurgically bonding the first metal material to the second metal material and for breaking up the layers of at least one of the metal materials to form a composite material having portions of said one metal material distributed in a matrix of the other metal material.

2. A method for making a heat-transfer member of selected thermal expansion properties comprising the steps of providing at least one layer of a first metal material of relatively high thermal conductivity and at least one layer of a second metal material of relatively low thermal expansion properties, pressure rolling the layers of metal together with reduction in thickness thereof for metallurgically bonding the first metal material to the second metal material to form a composite multilayer metal, and pressure rolling a plurality of strips of the multilayer composite metal together with reduction in thicknesses thereof for metallurgically bonding the strips of the composite multilayer metal to each other and for breaking up the layers of the second metal material to form a composite material having portions of said second metal material distributed in a matrix of the first metal material and having the first metal material extending in continuous phase along three mutually perpendicular axes through the composite material.

3. A method according to claim 2 wherein the first metal material is selected from the group consisting of copper, silver and aluminum.

4. A method according to claim 3 wherein the second metal material is broken up to distribute portions of the metal material of relatively low coefficient of thermal expansion in a matrix of the metal material of relatively high thermal conductivity extending in continuous phase along the three axes.

5. A method according to claim 4 wherein the second metal material is selected from the group consisting of molybdenum and iron alloys having a nominal composition by weight of from about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese and the balance iron.

6. A method for making a heat-transferring circuit substrate member of limited thermal expansion properties comprising the steps of providing a plurality of layers of copper metal material of relatively high thermal conductivity an a plurality of layers of an iron alloy metal material having a composition by weight of 36 percent nickel and the balance iron, cold pressure rolling the layers of metal together in interleaved relation with reduction in thickness thereof for metallurgically bonding layers of copper metal material to layers of iron alloy metal material in the solid phase to form a composite multilayer metal, and repeatedly cold pressure rolling a plurality of strips of the composite multilayer metal together with reduction in thickness thereof for metallurgically bonding the strips of the composite multilayer metal together in the solid phase and for breaking up the layers of the iron alloy metal material to form a composite material having portions of the iron alloy metal material distributed in a matrix of the copper metal material extending in continuous phase along three mutually perpendicular axes through the composite material.

7. A method according to claim 6 wherein three layers of the copper metal material are interleaved with two layers of iron alloy metal material each of 0.020 inches thickness and are cold pressure rolled with 60 percent thickness reduction to form the composite multilayer metal, the composite multilayer metal is cold pressure rolled with 50 percent thickness reduction to a thickness of 0.020 inches, five strips of the composite multilayer metal of 0.020 inches thickness are cold pressure rolled with 60 percent thickness reduction for metallurgically bonding the strips together, the metallurgically-bonded strips are cold pressure rolled with 50 percent thickness reduction to a thickness of 0.020 inches, and five strips of the metallurgically-bonded strips of 0.020 inches thickness are cold pressure rolled with 60 percent thickness reduction to form the composite material having portions of the iron alloy metal material distributed in the matrix of the copper metal material extending in continuous phase along the three axes.

8. A heat-transfer member of selected thermal expansion properties which is the product of the process comprising the steps of pressure rolling a plurality of layers of a first metal material of relatively high thermal conductivity in interleaved relation with a plurality of layers of a second metal material of relatively low thermal expansion properties with reduction in thicknesses thereof for metallurgically bonding the first metal material to the second metal material and for breaking up the layers of at least one of the metal materials to form a composite material having portions of said one metal material distributed in a matrix of the other metal material.

9. A heat-transfer member of selected thermal expansion properties which is the product of the process comprising the steps of providing at least one layer of a first metal material of relatively high thermal conductivity and at least one layer of a second metal material of relatively low thermal expansion properties, pressure rolling the layers of metal together with reduction in thickness thereof for metallurgically bonding the first metal material to the second metal material to form a composite multilayer metal, and pressure rolling a plurality of strips of the multilayer composite metal together with reduction in thicknesses thereof for metallurgically bonding the strips of the composite multilayer metal to each other and for breaking up the layers of the second metal material to form a composite material having portions of said second metal material distributed in a matrix of the first metal material and having the first metal material extending in continuous phase along three mutually perpendicular axes through the composite material.

10. A member according to claim 9 wherein the first metal material is selected from the group consisting of copper, silver and aluminum.

11. A member according to claim 10 wherein the second metal material is broken up to distribute portions of the metal material of relatively low coefficient of thermal expansion in a matrix of the metal material of relatively high thermal conductivity extending in continuous phase along the three axes.

12. A member according to claim 11 wherein the second metal material is selected from the group consisting of molybdenum and iron alloys having a nominal composition by weight of from about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese and the balance iron.

13. A heat-transferring circuit substrate member of limited thermal expansion properties which is the product of the process comprising the steps of providing a plurality of layers of copper metal material of relatively high thermal conductivity an a plurality of layers of an iron alloy metal material having a composition by weight of 36 percent nickel and the balance iron, cold pressure rolling the layers of metal together in interleaved relation with reduction in thickness thereof for metallurgically bonding layers of copper metal material to layers of iron alloy metal material in the solid phase to form a composite multilayer metal, and repeatedly cold pressure rolling a plurality of strips of the composite multilayer metal together with reduction in thickness thereof for metallurgically bonding the strips of the composite multilayer metal together in the solid phase and for breaking up the layers of the iron alloy metal material to form a composite material having portions of the iron alloy metal material distributed in a matrix of the copper metal material extending in continuous phase along three mutually perpendicular axes through the composite material.

14. A member according to claim 13 wherein three layers of the copper metal material are interleaved with two layers of iron alloy metal material each of 0.020 inches thickness and are cold pressure rolled with 60 percent thickness reduction to form a composite multilayer metal, the composite multilayer metal is cold pressure rolled with 50 percent thickness reduction to a thickness of 0.020 inches, five strips of the composite multilayer metal of 0.020 inches thickness are cold pressure rolled with 60 percent thickness reduction for metallurgically bonding the strips together, the metallurgically-bonded strips are cold pressure rolled with 50 percent thickness reduction to a thickness of 0.020 inches, and five strips of the metallurgically-bonded strips of 0.020 inches thickness are cold pressure rolled with 60 percent thickness reduction to form the composite material having portions of the iron alloy metal material distributed in the matrix of the copper metal material extending in continuous phase along the three axes.

15. A circuit unit comprising a heat-transferring circuit substrate member of limited thermal expansion properties, circuit path means provided on the substrate in electrically insulated relation thereto, and circuit components mounted on the substrate member connected to the circuit path means, the substrate member being the product of the process comprising the steps of providing at least one layer of a first metal material of relatively high thermal conductivity and at least one layer of a second metal material of relatively low thermal expansion properties, pressure rolling the layers of metal together with reduction in thickness thereof for metallurgically bonding the first metal material to the second metal material to form a composite multilayer metal, and pressure rolling a plurality of strips of the multilayer composite metal together with reduction in thicknesses thereof for metallurgically bonding the strips of the composite multilayer metal to each other and for breaking up the layers of the second metal material to form a composite material having portions of said second metal material distributed in a matrix of the first metal material and having the first metal material extending in continuous phase along three mutually perpendicular axes through the composite material.

* * * * *